US 9,853,191 B2

(12) United States Patent
Iwata et al.

(10) Patent No.: US 9,853,191 B2
(45) Date of Patent: Dec. 26, 2017

(54) LIGHT EMITTING DEVICE MANUFACTURING METHOD

(71) Applicant: NICHIA CORPORATION, Anan-shi (JP)

(72) Inventors: Hiroshi Iwata, Tokushima (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/374,234

(22) Filed: Dec. 9, 2016

(65) Prior Publication Data

US 2017/0170371 A1    Jun. 15, 2017

(30) Foreign Application Priority Data

Dec. 10, 2015    (JP) .................................. 2015-241647

(51) Int. Cl.
| H01L 33/56 | (2010.01) |
| H01L 33/50 | (2010.01) |
| H01L 33/60 | (2010.01) |
| H01L 33/62 | (2010.01) |
| H01L 33/54 | (2010.01) |

(52) U.S. Cl.
CPC ............ *H01L 33/504* (2013.01); *H01L 33/56* (2013.01); *H01L 33/60* (2013.01); *H01L 33/62* (2013.01); *H01L 33/54* (2013.01); *H01L 2224/16225* (2013.01); *H01L 2933/005* (2013.01);

(Continued)

(58) Field of Classification Search
None
See application file for complete search history.

(56) References Cited

U.S. PATENT DOCUMENTS

2002/0187571 A1   12/2002   Collins, III et al.
2004/0183439 A1*   9/2004   Aoki .................... C09K 11/595
                                                                        313/582

(Continued)

FOREIGN PATENT DOCUMENTS

JP        2003-069086        3/2003
JP        2005-303289       10/2005

(Continued)

*Primary Examiner* — Bilkis Jahan
(74) *Attorney, Agent, or Firm* — Mori & Ward, LLP (57) ABSTRACT

A light emitting device manufacturing method includes bonding an electrode of a light emitting element to a conductive member of a base. First wavelength conversion particles, second wavelength conversion particles and filling particles are electrodeposited on a surface of the light emitting element to form a wavelength conversion layer in which the filling particles are disposed among the first wavelength conversion particles and the second wavelength conversion particles. The first wavelength conversion particles contain aluminum. The second wavelength conversion particles have surfaces covered with covering material which contains aluminum. The filling particles contain aluminum. The filling particles have particle size smaller than particle sizes of both the first wavelength conversion particles and the second wavelength conversion particles. The filling particles have aspect ratio smaller than aspect ratios of both the first wavelength conversion particles and the second wavelength conversion particles.

16 Claims, 4 Drawing Sheets

(52) U.S. Cl.
CPC ............... *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 2004/0256974 A1 | 12/2004 | Mueller-Mach et al. |
| 2006/0255710 A1 | 11/2006 | Mueller-Mach et al. |
| 2007/0159063 A1* | 7/2007 | Kubota ................ C09K 11/584 313/502 |
| 2010/0176713 A1* | 7/2010 | Hanamoto .......... C01B 21/0826 313/501 |
| 2010/0200874 A1* | 8/2010 | Shioi ................ C09K 11/0883 257/91 |
| 2011/0235309 A1* | 9/2011 | Miki .................... C04B 35/597 362/97.2 |
| 2012/0026426 A1* | 2/2012 | Hanamoto ......... C09K 11/0883 349/62 |
| 2012/0306354 A1 | 12/2012 | Seibel, II et al. |
| 2013/0256715 A1 | 10/2013 | Itoh et al. |
| 2013/0257264 A1 | 10/2013 | Tamaki et al. |
| 2013/0286632 A1* | 10/2013 | Edwards ............... H01L 33/502 362/84 |

FOREIGN PATENT DOCUMENTS

| | | |
|---|---|---|
| JP | 2006-274265 | 10/2006 |
| JP | 2013-203822 | 10/2013 |
| JP | 2013-229438 | 11/2013 |
| JP | 2013-247067 | 12/2013 |
| JP | 2014-519540 | 8/2014 |
| JP | 2015-063619 | 4/2015 |
| JP | 2015-134919 | 7/2015 |
| WO | WO 2012/077656 | 6/2012 |

\* cited by examiner

LIGHT EMITTING DEVICE MANUFACTURING METHOD

CROSS-REFERENCE TO RELATED APPLICATIONS

The present application claims priority under 35 U.S.C. §119 to Japanese Patent Application No. 2015-241647, filed Dec. 10, 2015. The contents of this application are incorporated herein by reference in their entirety.

BACKGROUND

Technical Field

The present invention relates to a light emitting device manufacturing method.

Discussion of the Background

Generally, a light emitting device having a light emitting element such as a light emitting diode (LED) includes electronic components such as a light emitting element and a protective element, a substrate on which the electronic components are disposed, and a light-transmissive resin for protecting, for example, the light emitting element and the protective element.

Japanese Unexamined Patent Application Publication No. 2003-69086 discloses a light emitting device in which fluorescent material particles are deposited on a light emitting element to form a fluorescent material layer having a substantially uniform thickness by a so-called electrodeposition method. With the light emitting device, light emitted from the light emitting element is subject to wavelength conversion by the fluorescent material layer, thereby the light emitting device outputting white color-based light by a combination of the wavelength converted light and the light emitted from the light emitting element.

SUMMARY

According to one aspect of the present disclosure, a light emitting device manufacturing method includes bonding an electrode of a light emitting element to a conductive member of a base. First wavelength conversion particles, second wavelength conversion particles and filling particles are electrodeposited on a surface of the light emitting element to form a wavelength conversion layer in which the filling particles are disposed among the first wavelength conversion particles and the second wavelength conversion particles. The first wavelength conversion particles contains aluminum. The second wavelength conversion particles have surfaces covered with covering material which contains aluminum. The filling particles each contain aluminum. The filling particles have particle size smaller than particle sizes of both the first wavelength conversion particles and the second wavelength conversion particles. The filling particles have aspect ratio smaller than aspect ratios of both the first wavelength conversion particles and the second wavelength conversion particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

An embodiment of the present invention is described below with reference to the drawings. The following embodiment however is an example of a light emitting device manufacturing method for embodying a technical idea of the present invention, and the present invention is not limited to the following light emitting device manufacturing method.

Further, the present specification never specifies members in the appended claims to members to be described in the embodiment. Particularly, the dimension, material, shape, relative position, and the like of components described in the embodiment are not intended to limit the range of the present invention only thereto unless otherwise particularly specified. The size, positional relationship, and the like of the members illustrated in the drawings are sometimes exaggerated for clear description. In the description below, the identical name and numerical reference sign indicate an identical or equivalent member, and detailed description for such a member is appropriately omitted.

The adhesion between a wavelength conversion layer formed by an electrodeposition method and a light emitting element is attributed to the particle size and the aspect ratio of the wavelength conversion particles. Poverty in the adhesion between a wavelength conversion layer and a light emitting element 20 may possibly cause peeling of the wavelength conversion layer from the light emitting element 20. The wavelength conversion layer is an aggregate in which the wavelength conversion particles are continuously connected to each other.

Figure 1A:
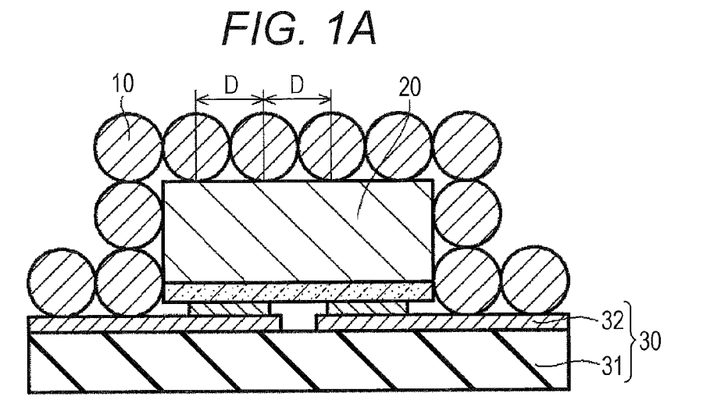
FIG. 1A is a schematic sectional view of a light emitting device that includes wavelength conversion particles having size larger than that of wavelength conversion particles illustrated in FIG. 1B.
Figure 1B:
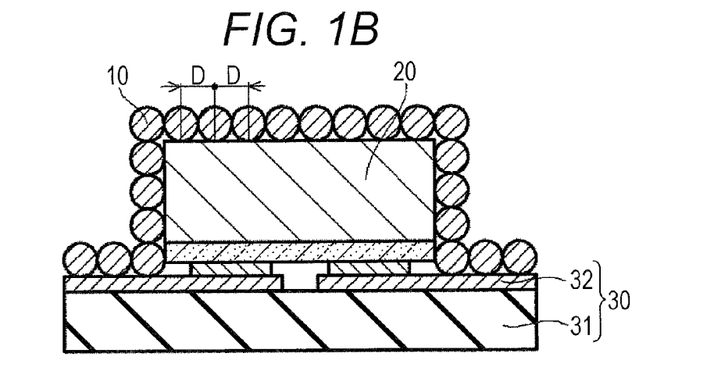
FIG. 1B is a schematic sectional view of a light emitting device that includes wavelength conversion particles having size smaller than that of wavelength conversion particles illustrated in FIG. 1A.

The larger the size of the wavelength conversion particles is, the poorer the adhesion between the wavelength conversion layer and the light emitting element 20 may possibly become. As illustrated in FIGS. 1A and 1B, when wavelength conversion particles 10 are tightly formed on a surface of the light emitting element 20, gaps D between the points where the light emitting element 20 is in contact with the wavelength conversion particles 10 tends to become wider with increasing size of the wavelength conversion particles 10. When shape of the wavelength conversion particles 10 is sphere, the gaps D between the points where the light emitting element 20 is in contact with the wavelength conversion particles 10 are about the same value as the size of the wavelength conversion particles 10. Therefore, the gaps D between the points where the light emitting element 20 is in contact with the wavelength conversion particles 10 widens with increasing size of the wavelength conversion particles 10. As gaps D between the points where the light emitting element 20 is in contact with the wavelength conversion particles 10 become wider, the number of points where the light emitting element 20 is in contact with the wavelength conversion particles 10 decreases. Accordingly, the adhesion between the wavelength conversion layer and the light emitting element 20 becomes poor.

The smaller the size of the wavelength conversion particle 10 is, the more easily the light emitted from the light emitting element 20 is scattered by the wavelength conversion layer. The scattered light is likely to hit the light emitting element 20 and the wavelength conversion particles 10. When the scattered light hits the light emitting element 20 and the wavelength conversion particles 10, a part of the light is absorbed by the light emitting element 20 and the wavelength conversion particles 10. Therefore, in order to increase light extraction efficiency, it is preferable to use the wavelength conversion particles 10 having large particles size.

In the present specification, the particle size means a 50% of particle size (on volumetric basis) in a particle size distribution measured by an electric resistance method with Coulter Multisizer II (manufacture by Beckman Coulter, Inc.). The electric resistance method is a method of using the relativity between the electric resistance and the particle size when dispersed particles pass between electrodes. Therefore, when measurement of the primary particles is difficult because the particles are strongly aggregated, the particle size of aggregated secondary particles is to be measured.

The larger the aspect ratio of the wavelength conversion particle 10 is, the poorer the adhesion between the wavelength conversion layer and the light emitting element 20 may possibly become. In the present specification, the aspect ratio is obtained, according to Japanese Industrial Standards (JIS Z 8900-1: 2008), by imaging 100 or more particles with a scanning electron microscope, measuring the longest diameter and the width orthogonal to the longest diameter of the particles in the image of the group of particles, acquiring the averages of the longest diameters and the widths, respectively, and defining the ratio between the averages as the aspect ratio.

Figure 1C:
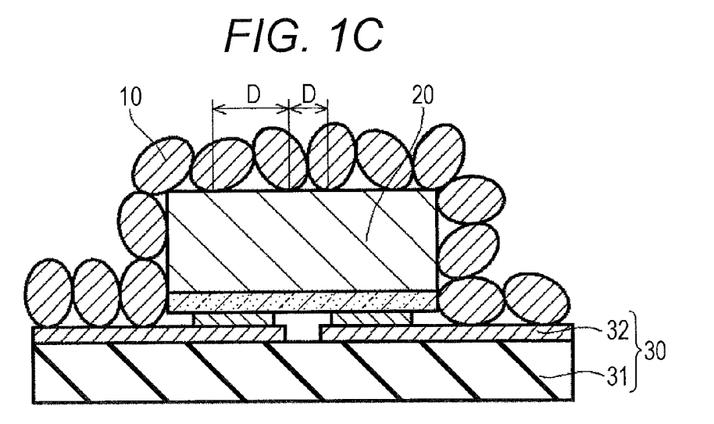
FIG. 1C is a schematic sectional view of a light emitting device that includes wavelength conversion particles having an aspect ratio larger than those of the wavelength conversion particles illustrated in FIGS. 1A and 1B.

When the wavelength conversion particle 10 has an aspect ratio of 1 to form a circular shape in a sectional view, gaps D each between the points where the light emitting element 20 is in contact with the wavelength conversion particles 10 are likely to be about the same distance as illustrated in FIGS. 1A and 1B. When the wavelength conversion particle 10 has an aspect ratio larger than that of a circular shape to form an elliptical shape in a sectional view, the gaps D between the points where the light emitting element 20 is in contact with the wavelength conversion particles 10 is likely to vary as illustrated in FIG. 1C.

When the wavelength conversion particle 10 has an elliptical shape in a sectional view, the width of the wavelength conversion particle 10 is likely to vary in the direction parallel to the surface of the light emitting element 20. For example, when the wavelength conversion particles 10 have circular shape in a sectional view as illustrated in FIGS. 1A and 1B, widths of the wavelength conversion particles 10 do not change in the direction parallel to the surface of the light emitting element 20 in whichever direction the wavelength conversion particles 10 are disposed. However, when the wavelength conversion particle 10 have elliptical shape in a sectional view, the widths of the wavelength conversion particles 10 are likely to vary in the direction parallel to the surface of the light emitting element 20 depending on the direction in which the wavelength conversion particles 10 are disposed.

Therefore, when the wavelength conversion particle 10 has a large aspect ratio, the gap D between the points where the light emitting element 20 is in contact with the wavelength conversion particle 10 is likely to vary. In a part having a wide gap D between the points where the light emitting element 20 is in contact with the wavelength conversion particles 10, the adhesion between the wavelength conversion layer and the light emitting element 20 is likely to be poor. For the purpose of description, the wavelength conversion particles 10 are set to circular shape or elliptical shape in a sectional view, and the actual shape includes not only the circular shape and the elliptical shape but also various shape such as substantially rectangular parallelepiped shape and shape having irregularities on a surface thereof.

Use of a plurality of types of wavelength conversion particles are more likely to cause poor adhesion between the wavelength conversion layer and the light emitting element, compared to use of one type of wavelength conversion particles. Use of a plurality of types of wavelength conversion particles is likely to cause variation in the particle size and the aspect ratio of the wavelength conversion particles in the wavelength conversion layer. That is, the gaps between the points where the light emitting element is in contact with the plurality of types of wavelength conversion particles are likely to vary. Therefore, in a part having a wide gap among various gaps each between the points where the light emitting element is in contact with the plurality of types of wavelength conversion particles, the adhesion between the wavelength conversion layer and the light emitting element is likely to be poor. Even in the case of using one type of wavelength conversion particles, each of the wavelength conversion particles has a different particle size and a different aspect ratio. Therefore, use of a plurality of types of wavelength conversion particles are more likely to cause wide variations in the particle size and the aspect ratio of the wavelength conversion particles than use of one type of wavelength conversion particles.

In the light emitting device according to the present embodiment, the wavelength conversion layer contains filling particles having smaller particle size and smaller aspect ratio than those of the wavelength conversion particles. The filling particles are disposed among particles of the wavelength conversion particles to improve the adhesion between the wavelength conversion layer and the light emitting element.

When two types of wavelength conversion particles defined as first wavelength conversion particles and second wavelength conversion particles, the first and the second wavelength conversion members preferably include the same element. The adhesion between the first wavelength conversion particles and the second wavelength conversion particles is more likely to improve when the first wavelength conversion particles and the second wavelength conversion particles include the same element than when the first wavelength conversion particles and the second wavelength conversion particles do not include the same element.

Further, the first wavelength conversion particles and the second wavelength conversion particles preferably contain aluminum. The first wavelength conversion particles and the second wavelength conversion particles that include aluminum can decrease the difference in the charged state between the first wavelength conversion particles and the second wavelength conversion particles in an electrodeposition bath liquid during an electrodeposition process described later. Thus, the first wavelength conversion particles and the second wavelength conversion particles are formed with less uneven formation in the wavelength conversion layer to improve the adhesion between the wavelength conversion layer and the light emitting element.

Even when the second wavelength conversion particles do not contain aluminum, or even when the second wavelength conversion particles are, in spite of containing aluminum, less likely to be charged in the electrodeposition bath liquid than the first wavelength conversion particles, the surface of the second wavelength conversion particles can be covered with a covering member containing aluminum to decrease the difference in the charged state between the first wavelength conversion particles and the second wavelength conversion particles. Thus, the first wavelength conversion particles and the second wavelength conversion particles are formed with less uneven formation in the wavelength conversion layer, therefore the adhesion between the wavelength conversion layer and the light emitting element can be improved.

Hereinafter, detailed description is provided for each of the steps of the light emitting device manufacturing method according to the embodiment of the present invention.

Step 1. Step of Bonding Light Emitting Element to Base Member

Figure 2A:
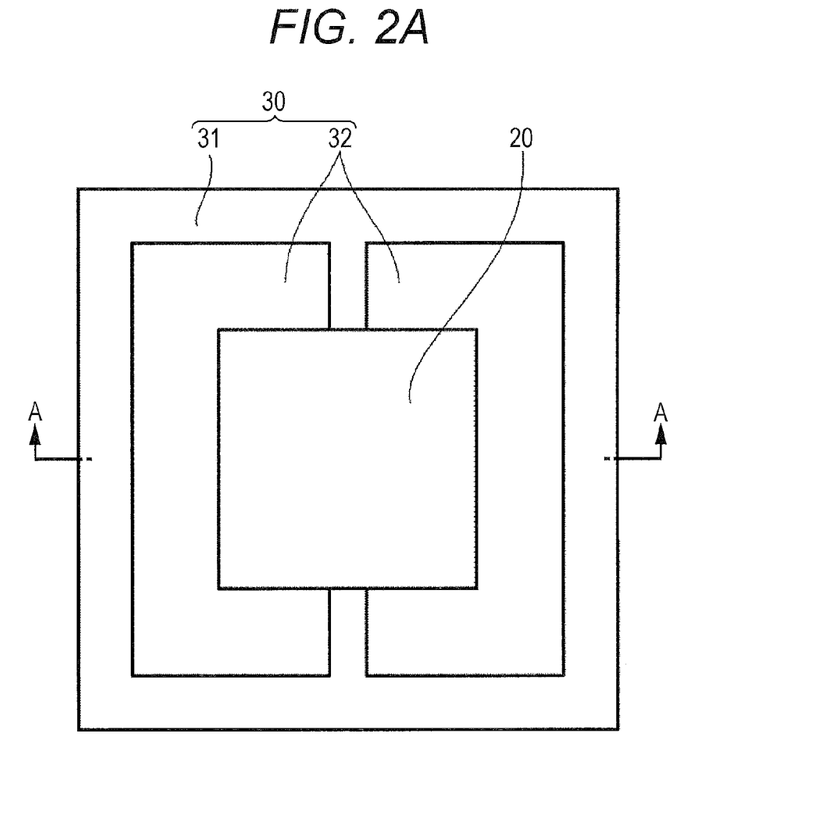
FIG. 2A is a schematic plan view illustrating Step 1.
Figure 2B:
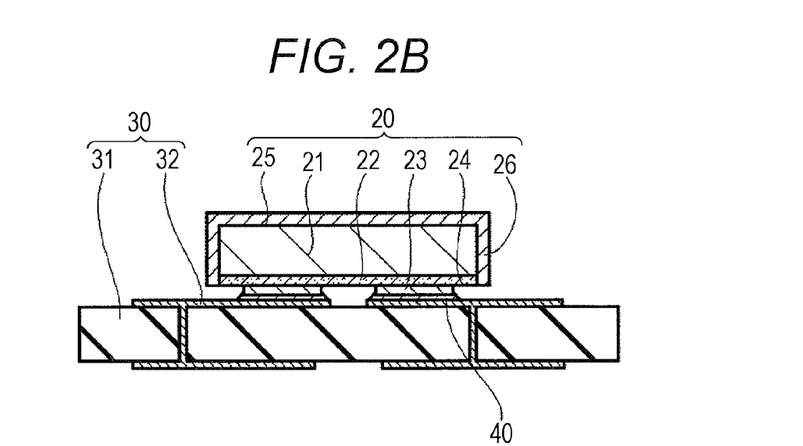
FIG. 2B is a schematic sectional view taken along line A-A in FIG. 2A.

A base member 30 (a base 30) having a conductive member 32 is prepared. As illustrated in FIG. 2A, the base member 30 includes an insulating supporting board 31 and a pair of conductive members 32 provided on an upper surface of the supporting board 31. Subsequently, as illustrated in FIG. 2B, an electrode 23 of a light emitting element 20 is bonded onto each of the pair of conductive members 32 with a conductive bonding member 40 interposed between the electrode 23 and the conductive member 32.

The light emitting element 20 includes a holding substrate 21, a semiconductor layer 22, and at least a pair of electrodes 23 provided on a semiconductor layer 22 side. A surface of the light emitting element 20, which has the pair of electrodes 23, is referred to as an electrode formed surface 24, and a surface on an opposite side to the electrode formed surface is referred to as a light extraction surface 25. When the holding substrate 21 is insulating, the light emitting element 20 further includes a conductive first covering layer 26 that covers the light extraction surface 25 of the holding substrate 21 and lateral surfaces of the holding substrate 21 between the electrode formed surface 24 and the light extraction surface 25 in order to form a wavelength conversion layer by an electrodeposition method described later. Also when the holding substrate 21 is electrically conductive, the light emitting element may include the first covering layer 26.

The first covering layer 26 preferably includes aluminum. First wavelength conversion particles, second wavelength conversion particles, and filling particles that are included in the wavelength conversion layer described later contain aluminum so that the first covering layer 26 including aluminum increases the adhesion between the first covering layer and the wavelength conversion layer.

Step 2-1. Step of Forming Wavelength Conversion Layer

Figure 3:
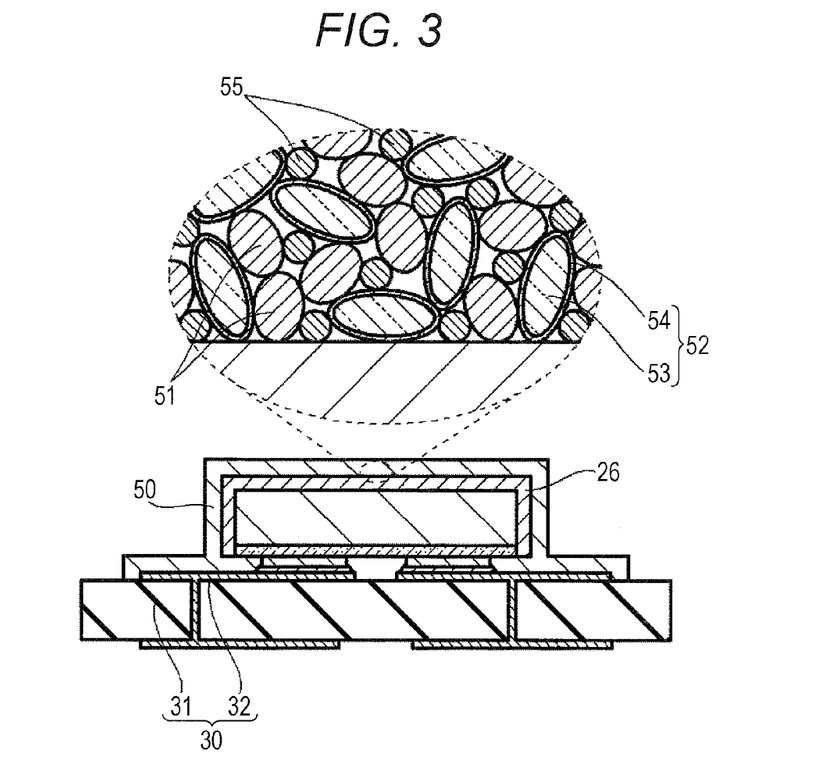
FIG. 3 is a schematic sectional view illustrating Step 2-1 and a schematic enlarged view of a dotted line region.

A wavelength conversion layer 50 is formed by electrodeposition. The base member having the light emitting element mounted thereon is immersed in an electrodeposition bath liquid including the first wavelength conversion particles, the second wavelength conversion particles, and the filling particles, followed by electrification. Thus, the wavelength conversion layer 50 is formed on a surface of the light emitting element 20 and a surface of the conductive member 32 as illustrated in FIG. 3. As illustrated in the enlarged view of the dotted line region of FIG. 3, the wavelength conversion layer 50 is formed so as to have the first wavelength conversion particles 51 and the second wavelength conversion particles 52 disposed in a mixed manner, with the filling particles 55 disposed among the first wavelength conversion particles 51 and the second wavelength conversion particles 52.

The electrodeposition bath liquid includes a solvent and an electrolyte in addition to the first wavelength conversion particles, the second wavelength conversion particles, and the filling particles. As the solvent, nonaqueous solvents such as isopropyl alcohol and acetone are preferable. As the electrolyte, members known in the art such as magnesium nitrate can be used. By dispersing the first wavelength conversion particles, the second wavelength conversion particles, and the filling particles in the electrodeposition bath liquid including the electrolyte, the first wavelength conversion particles, the second wavelength conversion particles, and the filling particles can be charged. Then, electrification of the light emitting element and the conductive member causes deposition of the first wavelength conversion particles, the second wavelength conversion particles, and the filling particles on the surfaces of the light emitting element and the conductive member, thereby forming the wavelength conversion layer.

As the electrolyte, it is preferable to use magnesium nitrate. Magnesium nitrate changes into magnesium hydroxide by a chemical reaction during the electrodeposition. This magnesium hydroxide serves as a binding material that binds the light emitting element, the first wavelength conversion particles, the second wavelength conversion particles, and the filling particles. Therefore, the adhesion between the wavelength conversion layer and the light emitting element can further be improved.

The first wavelength conversion particles 51 and the second wavelength conversion particles 52 are members for converting the light emitted from the light emitting element 20, which has a first peak wavelength, into light having a second peak wavelength different from the first peak wavelength.

For the first wavelength conversion particles 51, a particulate material including aluminum can be used. For the material of the first wavelength conversion particles 51, for example, YAG can be used. The second wavelength conversion particles 52 include a particulate base material 53 and a covering member 54 that covers the surface of the base material 53. For a material of the base material 53, a material that does not contain aluminum can be used as well as a material containing aluminum as likewise the first wavelength conversion particles 51. For the material for the base material 53, for example, SCASN can be used. For a material for the covering member 54, a material, which contains aluminum, can be used. For the material for the covering member 54, for example, aluminum oxide can be used.

For example, when YAG and SCASN are used as the wavelength conversion particles, SCASN is preferably covered by aluminum oxide, or the like, because SCASN is less likely to be charged in the electrodeposition bath liquid than YAG. That is, it is preferable to use YAG for the first wavelength conversion particles 51 and SCASN for the base material 53 for the second wavelength conversion particles 52. By using the materials described above, SCASN that is less likely to be charged can be formed while dispersed in the wavelength conversion layer.

For the filling particles 55, a material, which contains aluminum is used. For the material for the filling particles 55, for example, aluminum oxide can be used. The size of the filling particles 55 is smaller than the sizes of both the first wavelength conversion particles 51 and the second wavelength conversion particles 52.

The filling particles 55 have particle size smaller than those of the first wavelength conversion particles 51 and the second wavelength conversion particles 52, thereby being likely to be disposed among particles of the first wavelength conversion particles 51 and the second wavelength conversion particles 52. By containing the filling particles 55 among the first wavelength conversion particles 51 and the second wavelength conversion particles 52, the number of the contact points with the light emitting element 20 is more likely to increase in the wavelength conversion layer 50 formed of the first wavelength conversion particles 51, the second wavelength conversion particles 52, and the filling particles 55 compared to that in the wavelength conversion layer fainted of the first wavelength conversion particles 51 and the second wavelength conversion particles 52. Therefore, the adhesion between the wavelength conversion layer 50 and the light emitting element 20 can be improved.

Further, by containing the filling particles 55 among particles of the first wavelength conversion particles 51 and the second wavelength conversion particles 52, the density of the wavelength conversion layer 50 is increased. Therefore, adhesion in the wavelength conversion layer is increased by containing the filling particles 55.

Further, those having particle size larger than that of the filling particles 55 can be used as the first wavelength conversion particles 51 and the second wavelength conversion particles 52, so that the light extraction efficiency is improved compared to the case of using the first wavelength conversion particles 51 and the second wavelength conversion particles 52 that have the same particle size as that of the filling particles 55. The smaller the particle sizes of the first wavelength conversion particles 51 and the second wavelength conversion particles 52 are, the more easily the light emitted from the light emitting element is scattered. Therefore, the scattered light is likely to hit the light emitting element 20, the first wavelength conversion particles 51, and the second wavelength conversion particles 52. When the scattered light hits the light emitting element 20, the first wavelength conversion particles 51, and the second wavelength conversion particles 52, a part of the light is absorbed by the light emitting element 20, the first wavelength conversion particles 51, and the second wavelength conversion particles 52. Thus, the first wavelength conversion particles 51 and the second wavelength conversion particles 52 that have small particle sizes degrade the light extraction efficiency.

The aspect ratio of the filling particles 55 is smaller than the aspect ratios of both the first wavelength conversion particles 51 and the second wavelength conversion particles 52. When the aspect ratio of the filling particles 55 is large, the gaps of the filling particles 55 in a direction parallel to the surface of the light emitting element 20 are likely to change largely depending on the direction in which the filling particles 55 are disposed. Even when gaps each between the points where the light emitting element 20 is in contact with the first wavelength conversion particles 51 and the second wavelength conversion particles 52 are the same, the filling particles 55 are disposed or not disposed among particles of the first wavelength conversion particles 51 and the second wavelength conversion particles 52 due to large change in the widths of the filling particles 55 in the direction parallel to the surface of the light emitting element 20. Therefore, the filling particles 55 are likely to cause variation in its disposition among particles of the first wavelength conversion particles 51 and the second wavelength conversion particles 52.

It is preferable to use the filling particles 55 having an aspect ratio smaller than those of both the first wavelength conversion particles 51 and the second wavelength conversion particles 52. The change in the widths of the filling particle 55 in the direction parallel to the surface of the light emitting element 20 decreases in whichever direction the filling particle 55 is disposed. Therefore, the filling particles 55 are likely to be evenly disposed among the first wavelength conversion particles 51 and the second wavelength conversion particles 52. With this configuration, the wavelength conversion layer 50 can be less likely to be peeled from the light emitting element 20.

Step 2-2. Step of Altering First Covering Layer

When the light emitting element 20 including the first covering layer 26 is used, it is preferable to perform a step of altering the first covering layer 26 to an insulating second covering layer. The alteration of the first covering layer to the insulating second covering layer reduces short circuits of the light emitting element. The step of alteration to the second covering layer can be performed by, for example, a method of placing the first covering layer in an environment at a temperature of 130° C. or more and a humidity of 90% or more to oxidize the first covering layer. Thus, the conductive first covering layer 26 can be altered to an insulating second covering layer. The second covering layer is preferably a member having light transmissivity so as not to block the light emitted from the light emitting element 20. For example, when the material for the first covering layer 26 is aluminum, the material for the second covering layer is to be aluminum oxide. Aluminum oxide has light transmissivity, thus it is preferable that aluminum oxide is the second covering layer.

Step 2-3. Step of Forming Reflecting Layer

Figure 4:
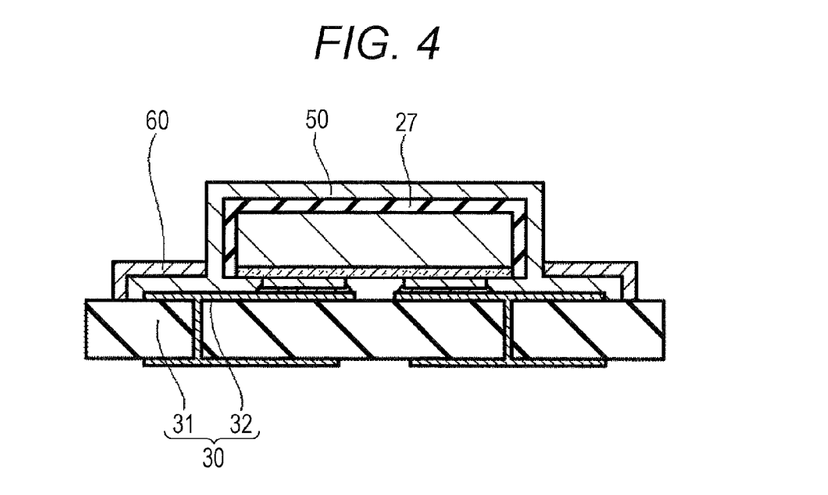
FIG. 4 is a schematic sectional view illustrating Step 2-3.

In the insulation process of the first covering layer, only the first covering layer that covers the light emitting element is insulated, and the conductive member on the supporting board is not insulated. Therefore, as illustrated in FIG. 4, a reflecting layer 60 may be formed, which covers the wavelength conversion layer formed on the conductive member by the electrodeposition step. The reflecting layer 60 is an aggregate of a light reflecting member. The reflecting layer 60 is formed by immersing the base member having the light emitting element mounted thereon in the electrodeposition bath liquid containing the light reflecting member, followed by electrification. The reflecting layer 60 is less likely to be formed on a part of the wavelength conversion layer, which is covered with a second covering layer 27, because the second covering layer 27 is insulated. On the wavelength conversion layer 50 provided on the conductive member 32, the reflecting layer 60 can be formed. The formation of the reflecting layer 60 can reduce absorption of the light emitted from the light emitting element 20 by the wavelength conversion layer 50 formed on the conductive member 32.

Step 3. Step of Forming Light-Transmissive Resin

In order to further reduce peeling of the wavelength conversion layer 50 and/or the reflecting layer 60, a light-transmissive material may be formed to cover the wavelength conversion layer 50 and/or the reflecting layer 60. It is preferable to form an impregnation layer by impregnating with the light-transmissive material a space among particles of the wavelength conversion layer 50 and/or the reflecting layer 60.

As the light-transmissive material, for example, a silicone resin and an epoxy resin can be used. As a method of forming the light-transmissive material, for example, potting and spraying can be used.

Figure 5:
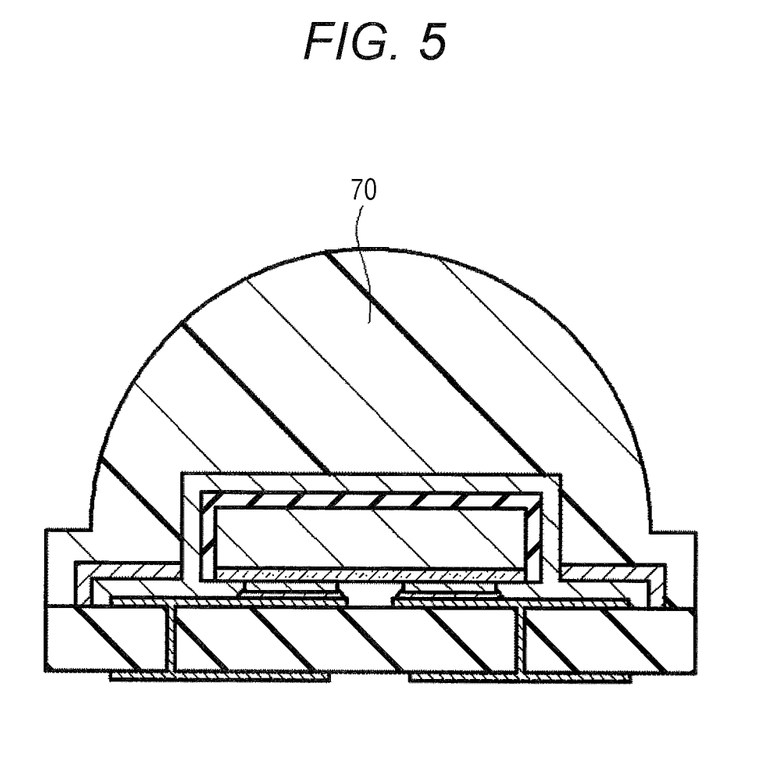
FIG. 5 is a schematic sectional view illustrating Step 3.

A lens that covers the light emitting element may be formed by a light-transmissive resin 70 as illustrated in FIG. 5. For the formation of the lens, a publicly known method can be used. For example, the lens can be formed by compression molding.

The formation of the light-transmissive resin 70 can further reduce the peeling of the wavelength conversion layer from the light emitting element. Further, by forming the wavelength conversion layer whose peeling from the light emitting element is reduced, the peeling of the wavelength conversion layer from the light emitting element can be reduced, which is caused by force during, for example, conveyance till the formation of the light-transmissive resin.

Hereinafter, each of the members is described in detail.

Base Member

A base member is provided to dispose electronic components such as a light emitting element and a protective element thereon, and includes an insulating supporting board and at least a pair of conductive members formed on an upper surface of the supporting board in a spaced apart manner. The base member is preferably in a shape with a flat upper surface, such as a rectangular flat plate shape, having a thickness in a range of about 0.3 mm to about 0.5 mm, for example.

Materials of the support plate include a resin and ceramic, for example. Examples of the resin include: thermosetting resins such as an epoxy resin, a silicone resin, a BT resin, a polyimide resin, and an unsaturated polyester resin; thermoplastic resins such as a polyphthalamide resin and a nylon resin; modified resins thereof; and a hybrid resin including at least one of these resins. Examples of the ceramic include alumina and aluminum nitride. The supporting board may be a single-layer structure or a multi-layer structure. To the supporting board may be added, for example, a coloring agent, a filling material, and a reinforced fiber that are known in the art.

Each of the conductive members is provided on a surface, which faces a light emitting element, of the supporting board. The conductive member may be provided in the supporting board or on a surface opposite to the surface, which faces the light emitting element, of the supporting board. The conductive member is used for applying a voltage from an external power source to electronic components such as a light emitting element. The conductive member can be formed by metals such as copper, aluminum, gold, silver, tungsten, iron and nickel, or alloys such as an iron-nickel alloy and phosphor bronze. The conductive member preferably has a surface covered with a highly reflective material such as silver or gold in order to efficiently extract the light from the light emitting element. The thickness of the conductive member is preferably about 5 µm to 80 µm, for example.

Light Emitting Element

The light emitting element is flip-chip mounted on the conductive member formed on the supporting board. As a light emission color of the light emitting element, wavelength light can be appropriately selected according to the use application. For example, as a blue (light having a wavelength of 430 nm to 490 nm) light emitting element, a nitride semiconductor can be used. As the nitride semiconductor, for example, $In_XAl_YGa_{1-X-Y}N$ ($0 \le X \le 1$, $0 \le Y \le 1$, $X+Y \le 1$) can be used. As the light emitting element, one having a facedown structure can be used. The protective element may be mounted on the conductive member on which the light emitting element is not mounted.

The light emitting element has a semiconductor layer and a holding substrate disposed on the conductive member in this order. The semiconductor layer includes a pair of electrodes on a surface thereof which faces the conductive member. The shape of the electrodes of the light emitting element can be formed into various shape such as substantially rectangular shape and circular shape. The material for the electrodes of the light emitting element is sufficient if it is conductive, and a known material is used.

Bonding Member

A bonding member is provided to electrically connect the conductive member to the light emitting element, and to fix the light emitting element onto the conductive member. The bonding member is disposed so as to interpose between at least the electrodes of the light emitting element and the conductive members. Examples of the material for the bonding member include soldering materials such as Sn—Cu, Sn—Ag—Cu, and Au—Sn, metal bumps of, for example, gold, and anisotropic conductive pastes.

First Wavelength Conversion Particle and Second Wavelength Conversion Particle

First wavelength conversion particles and second wavelength conversion particles are members for converting the light, which is emitted from the light emitting element and has a first peak wavelength, to light having a second peak wavelength different from the first peak wavelength. In the present specification, the member for converting the wavelength is one that converts a first peak wavelength to a second peak wavelength having a difference of larger than 10 nm from the first peak wavelength.

The first wavelength conversion particles are sufficient if the particles contains aluminum and are excitable. For example, the first wavelength conversion particles preferably contain at least one selected from a nitride-based fluorescent material, an oxynitride-based fluorescent material, and a SiAlON-based fluorescent material that are mainly activated by lanthanoid-based elements such as Eu and Ce; an alkali earth metal aluminate fluorescent material; a rare earth aluminate fluorescent material mainly activated by lanthanoid-based elements such as Ce; and an organic material or organic complex mainly activated by lanthanoid-based elements such as Eu.

Specifically, examples of phosphors are an yttrium-aluminum-garnet-based fluorescent material activated by cerium (Ce: YAG); a lutetium-aluminum-garnet-based fluorescent material activated by cerium (Ce: LAG); a nitrogen-containing calcium aluminosilicate-based fluorescent material ($CaO-Al_2O_3-SiO_2$) activated by europium and/or chromium; and nitride-based fluorescent materials such as a β-SiAlON fluorescent material, a CASN-based fluorescent material, and a SCASN-based fluorescent material.

The second wavelength conversion particles include particulate base material and covering member that covers the surface of the base material. For a method of forming the covering member, known methods such as vapor deposition can be used. The material for the base material is sufficient if it is a material that converts light having a first peak wavelength to light having a second peak wavelength different from the first peak wavelength. For the material of the base material, a material that does not include aluminum can be used as well as materials available for the first wavelength conversion particle. Examples of the material for the base material, which does not include aluminum, include a silicate-based fluorescent material activated by europium, and a KSF fluorescent material. The silicate fluorescent material activated by europium, and the KSF fluorescent material can also be used for the first wavelength conversion particles when they contain aluminum.

The material including aluminum and having light transmissivity is sufficiently used for the covering member of the second wavelength conversion particles. Examples of the material for the covering member include aluminum oxide.

The second wavelength conversion particles are covered with the covering member including aluminum, so that the adhesion between the second wavelength conversion particles become higher than the adhesion between the first wavelength conversion particles when the first wavelength conversion particles and the second wavelength conversion particles are compared, which have the same particle size and the same aspect ratio. When magnesium nitrate is used as an electrolyte of an electrodeposition bath liquid, magnesium nitrate changes into magnesium hydroxide by a chemical reaction during electrodeposition. This magnesium hydroxide serves to bind the light emitting element, the first wavelength conversion particles, the second wavelength conversion particles, and a filling particles. Therefore, attachment of a great deal of electrolyte magnesium nitrate during the electrodeposition increases the adhesion.

The second wavelength conversion particle is covered with the covering member including aluminum, thus it is made easily charged during the electrodeposition compared to the first wavelength conversion particle having the same particle size and the aspect ratio as those of the second wavelength conversion particle. The second wavelength conversion particle that is made easily charged has a great deal of electrolyte magnesium nitrate attached thereto compared to the first wavelength conversion particle, making the adhesion between particles of the second wavelength conversion particle higher than the adhesion between the first wavelength conversion particles.

As described above, the larger the particle size is, the more the light extraction efficiency of the wavelength conversion particle is improved, so that the particle size of the wavelength conversion particle is preferably large. The adhesion of the second wavelength conversion particles can be made higher than those of the first wavelength conversion particles having the same particle size and the same aspect ratio as those of the second wavelength conversion particles, so that it is preferable to use the second wavelength conversion particles larger than the first wavelength conversion particles. By making the particle size of the second wavelength conversion particle larger than the particle size of the first wavelength conversion particle, the adhesion between the light emitting element and a wavelength conversion layer can be improved compared to the case in which the particle size of the first wavelength conversion particle is made larger than the particle size of the second wavelength conversion particle.

Further, the aspect ratio of the second wavelength conversion particle is preferably larger than the aspect ratio of the first wavelength conversion particle. The adhesion of the second wavelength conversion particle can be made higher than that of the first wavelength conversion particle having the same particle size and the same aspect ratio as those of the second wavelength conversion particle, thus it is preferable to make the aspect ratio of the second wavelength conversion particle larger than the aspect ratio of the first wavelength conversion particle. By making the aspect ratio of the second wavelength conversion particle larger than the aspect ratio of the first wavelength conversion particle, the adhesion between the light emitting element and the wavelength conversion layer can be improved compared to the case in which the aspect ratio of the first wavelength conversion particle is made larger than the aspect ratio of the second wavelength conversion particle.

Size of the first wavelength conversion particles is preferably in a range of 3.0 µm to 9.5 µm. The size of the first wavelength conversion particles smaller than 3.0 µm causes the first wavelength conversion particles to easily scatter the light emitted from the light emitting element so that the light output of the light emitting device may possibly be reduced. the size of the first wavelength conversion particles larger than 9.5 µm widen the gaps between the points where the light emitting element is in contact with the first wavelength conversion particles so that the adhesion between the wavelength conversion layer and the light emitting element may possibly be reduced.

The size of the second wavelength conversion particles is preferably in a range of 5.5 µm to 12.0 µm. The size of the second wavelength conversion particles smaller than 5.5 µm causes the second wavelength conversion particles to easily scatter the light emitted from the light emitting element, so that the light output of the light emitting device may possibly be reduced. The second wavelength conversion particles are covered with the covering member so more easily scatter the light emitted from the light emitting element than the first wavelength conversion particles. Therefore, the size of the second wavelength conversion particles is preferably larger than the size of the first wavelength conversion particles.

In case of size of the second wavelength conversion particles larger than 12.0 µm, the adhesion between the second wavelength conversion particles and the light emitting element may possibly be poor. The second wavelength conversion particles are covered with the covering member, thereby making the adhesion thereof higher than that of the first wavelength conversion particles having the same size and the same aspect ratio as those of the second wavelength conversion particles. Therefore, the second wavelength conversion particles can include particles having the size larger than the size of the first wavelength conversion particles.

Filling Particle

The material for the filling particles is sufficient if it includes aluminum and is not substantially excited by the light from the light emitting element. In the present specification, the phrase "not substantially excited by the light from the light emitting element" includes, in addition to the case of no excitation at all, a case of excitation in a range not departing from the spirit and scope of the present invention. That is, a material used for the filling particles can be other than the materials for, for example, the wavelength conversion particles, which are deliberately excited by the light from the light emitting element.

The filling particle can be a member that is not substantially excited by the light from the light emitting element, and a member can be appropriately selected, which is less likely to absorb the light from the light emitting element than the first wavelength conversion particles and the second wavelength conversion particles. Thus, even when the wavelength conversion layer includes the filling particles having size smaller than the sizes of the first wavelength conversion particles and the second wavelength conversion particles, the light extraction efficiency is less likely to be reduced. Examples of the material for the filling particles include aluminum oxide.

The filling particles have size which is preferably 0.1 times or more and 0.7 times or less size of wavelength conversion particles which are smaller of the first wavelength conversion particles and the second wavelength conversion particles. In case that the filling particles have size smaller than 0.1 times size of the smaller wavelength conversion particles, the light emitted from the light emitting element can be easily scattered. The filling particles having size larger than 0.7 times size of the smaller wavelength conversion particles make the filling particles less likely to be disposed among the first wavelength conversion particles and the second wavelength conversion particles.

The filling particles preferably have 0.05 times or more and 0.5 times or less size of wavelength conversion particles which are larger of the first wavelength conversion particles and the second wavelength conversion particles. In the case that the filling particles have size smaller than 0.05 times size of the larger wavelength conversion particles, the light emitted from the light emitting element can be easily scattered. The filling particles having size larger than 0.5 times size of the larger wavelength conversion particles make the filling particles less likely to be disposed among the first wavelength conversion particles and the second wavelength conversion particles.

The size of the filling particles is preferably in a range of about 0.3 μm to about 9.0 μm. When size of the filling particles is smaller than 0.3 μm, the filling particles easily scatter the light emitted from the light emitting element, so that the light extraction efficiency may possibly be reduced. The size of the filling particles larger than 9.0 μm make the filling particles less likely to be disposed among the first wavelength conversion particles and the second wavelength conversion particles, so that the adhesion between the wavelength conversion layer and the light emitting element is less likely to be improved.

The filling particles having aspect ratio approximate to 1.0 are likely to improve the adhesion between the light emitting element and the wavelength conversion layer. This is because the filling particles having aspect ratio in a range of 1.0 to 1.3 are likely to be disposed among the first wavelength conversion particles and the second wavelength conversion particles.

Further, three components including the filling particles, second covering layer, and covering member are preferably formed of aluminum oxide. This configuration is preferable because the adhesion between the wavelength conversion layer and the light emitting element is improved.

Reflecting Layer

A light reflecting member that constitutes a reflecting layer is preferably made of a material that can efficiently reflect the light emitted from the light emitting element, or the light whose wavelength is converted by the wavelength conversion layer. For example, a material is more preferable, which can reflect 70% or more of the light emitted from the light emitting element at the peak wavelength of the light. Further, a material is preferable, which is less likely to transmit or absorb the light emitted from the light emitting element, or the light whose wavelength is converted by the wavelength conversion layer. The light reflecting member is preferably made of an insulating material so as not to cause the conductive member to short-circuit.

The light reflective member cab be formed of a material capable of reflecting light, for example a powder of $SiO_2$, $TiO_2$, $ZrO_2$, $BaSO_4$, MgO, or the like to efficiently reflect light. A single one of two or more in combination of these materials may be used.

In accordance of embodiments of the present invention, the light emitting device can be produced, which has less risk of peeling of the wavelength conversion layer from the light emitting element Such light emitting device can be employed in a wide range of applications such as display devices, lighting fixtures, backlight light sources of liquid crystal display devices, and further facsimile machines, copying machines, and scanners, and projector devices.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device manufacturing method comprising:
    bonding an electrode of a light emitting element to a conductive member of a base; and
    electrodepositing, on a surface of the light emitting element, first wavelength conversion particles containing aluminum, second wavelength conversion particles having surfaces covered with covering material containing aluminum, and filling particles that contain aluminum, that have particle size smaller than particle sizes of both the first wavelength conversion particles and the second wavelength conversion particles, and that have aspect ratio smaller than aspect ratios of both the first wavelength conversion particles and the second wavelength conversion particles, to form a wavelength conversion layer in which the filling particles are disposed among the first wavelength conversion particles and the second wavelength conversion particles.

2. The light emitting device manufacturing method according to claim 1,
    wherein the surface of the light emitting element is covered with a first covering layer containing aluminum and being conductive, and
    wherein the light emitting device manufacturing method comprises altering the first covering layer to a second covering layer which is insulate, after forming the wavelength conversion layer.

3. The light emitting device manufacturing method according to claim 1, comprising:
    forming a light-transmissive resin covering the wavelength conversion layer, after forming the wavelength conversion layer.

4. The light emitting device manufacturing method according to claim 1, comprising:
    forming a reflecting layer covering the wavelength conversion layer formed on the conductive member, after forming the wavelength conversion layer.

5. The light emitting device manufacturing method according to claim 1, wherein the particle size of the second wavelength conversion particles is larger than the particle size of the first wavelength conversion particles.

6. The light emitting device manufacturing method according to claim 1, wherein the aspect ratio of the second wavelength conversion particles is larger than the aspect ratio of the first wavelength conversion particles.

7. The light emitting device manufacturing method according to claim 1, wherein the particle size of the first wavelength conversion particles is in a range of 3.0 μm to 9.5 μm.

8. The light emitting device manufacturing method according to claim 1, wherein the particle size of the second wavelength conversion particles is in a range of 5.5 μm to 12.0 μm.

9. The light emitting device manufacturing method according to claim 1, wherein the particle size of the filling particles is in a range of 0.3 μm to 9.0 μm.

10. The light emitting device manufacturing method according to claim 1, wherein the aspect ratio of the filling particles is in a range of 1.0 to 1.3.

11. The light emitting device manufacturing method according to claim 1, wherein the first wavelength conversion particles are made of YAG.

12. The light emitting device manufacturing method according to claim 1, wherein a base material of the second wavelength conversion is SCASN.

13. The light emitting device manufacturing method according to claim 1, wherein the filling particles are made of aluminum oxide.

14. The light emitting device manufacturing method according to claim 1, wherein the covering material is aluminum oxide.

15. The light emitting device manufacturing method according to claim 1, wherein the first wavelength conversion particles, the second wavelength conversion particles, and filling particles are mixed to produce an electrodeposition bath liquid.

16. The light emitting device manufacturing method according to claim 15, wherein the electrode connected to the base is immersed in the electrodeposition bath liquid.

* * * * *